United States Patent
Liu et al.

(10) Patent No.: US 11,340,299 B2
(45) Date of Patent: May 24, 2022

(54) SYSTEMS AND METHODS FOR MONITORING OF A HYBRID ENERGY STORAGE DEVICE

(71) Applicant: GM GLOBAL TECHNOLOGY OPERATIONS LLC, Detroit, MI (US)

(72) Inventors: Haijing Liu, Shanghai (CN); Wentian Gu, Shanghai (CN); Zhiqiang Yu, Shanghai (CN)

(73) Assignee: GM GLOBAL TECHNOLOGY OPERATIONS LLC, Detroit, MI (US)

(*) Notice: Subject to any disclaimer, the term of this patent is extended or adjusted under 35 U.S.C. 154(b) by 945 days.

(21) Appl. No.: 16/110,618

(22) Filed: Aug. 23, 2018

(65) Prior Publication Data

US 2019/0061555 A1    Feb. 28, 2019

(30) Foreign Application Priority Data

Aug. 24, 2017  (CN) .......................... 201710736033.6

(51) Int. Cl.
*H02J 7/00*        (2006.01)
*G01R 31/3835*     (2019.01)
(Continued)

(52) U.S. Cl.
CPC ........ *G01R 31/3835* (2019.01); *B60L 3/0046* (2013.01); *B60L 3/12* (2013.01);
(Continued)

(58) Field of Classification Search
USPC ................................ 320/132, 133, 134, 135
See application file for complete search history.

(56) References Cited

U.S. PATENT DOCUMENTS 4,473,815 A    9/1984   Miller, Sr.
7,806,095 B2  10/2010   Cook et al.
(Continued)

FOREIGN PATENT DOCUMENTS

CN    102263312 A    11/2011
CN    202628356 U    12/2012
(Continued)

OTHER PUBLICATIONS

Chinese Office Action dated May 25, 2021 (corresponding to CN 201710736033.6).

(Continued)

*Primary Examiner* — Brian Ngo
(74) *Attorney, Agent, or Firm* — Harness, Dickey & Pierce, P.L.C.

(57) ABSTRACT

A battery and supercapacitor system of a vehicle includes a lithium ion battery (LIB) having first and second electrodes, and a supercapacitor having third and fourth electrodes. A first reference electrode is disposed between the first and second electrodes and is configured to measure a first potential at a location between the first and second electrodes. A second reference electrode is disposed between the third and fourth electrodes and is configured to measure a second potential at a location between the third and fourth electrodes. The first electrode may be connected to the third electrode, and the second electrode may be connected to the fourth electrode. The first and second reference electrodes may not be connected to any of the first, second, third, or fourth electrodes.

21 Claims, 9 Drawing Sheets

(51) Int. Cl.

| | | |
|---|---|---|
| *B60L 50/64* | (2019.01) | |
| *H01M 10/04* | (2006.01) | |
| *H01G 11/14* | (2013.01) | |
| *H01G 11/28* | (2013.01) | |
| *H01M 16/00* | (2006.01) | |
| *B60L 50/40* | (2019.01) | |
| *H01G 11/16* | (2013.01) | |
| *H01G 11/08* | (2013.01) | |
| *B60L 58/10* | (2019.01) | |
| *H01G 11/76* | (2013.01) | |
| *B60L 3/12* | (2006.01) | |
| *H01M 10/48* | (2006.01) | |
| *G01R 31/36* | (2020.01) | |
| *B60L 3/00* | (2019.01) | |
| *H01G 11/22* | (2013.01) | |
| *H01M 10/0525* | (2010.01) | |
| *H01M 10/42* | (2006.01) | |
| *H01G 11/34* | (2013.01) | |
| *H01G 11/46* | (2013.01) | |
| *H01G 11/48* | (2013.01) | |

(52) U.S. Cl.
CPC .............. *B60L 50/40* (2019.02); *B60L 50/64* (2019.02); *B60L 58/10* (2019.02); *G01R 31/36* (2013.01); *H01G 11/08* (2013.01); *H01G 11/14* (2013.01); *H01G 11/16* (2013.01); *H01G 11/22* (2013.01); *H01G 11/28* (2013.01); *H01G 11/76* (2013.01); *H01M 10/0445* (2013.01); *H01M 10/0525* (2013.01); *H01M 10/4264* (2013.01); *H01M 10/48* (2013.01); *H01M 10/482* (2013.01); *H01M 16/00* (2013.01); *B60L 2240/547* (2013.01); *B60L 2240/549* (2013.01); *B60L 2260/26* (2013.01); *H01G 11/34* (2013.01); *H01G 11/46* (2013.01); *H01G 11/48* (2013.01); *H01M 2220/20* (2013.01)

(56) References Cited

U.S. PATENT DOCUMENTS

| | | |
|---|---|---|
| 7,963,264 B2 | 6/2011 | Reynolds |
| 10,297,885 B2 | 5/2019 | Gayden et al. |
| 2010/0075210 A1 | 3/2010 | Lee et al. |
| 2011/0293993 A1 | 12/2011 | Ryu |
| 2012/0323435 A1 | 12/2012 | Miller et al. |
| 2013/0266826 A1 | 10/2013 | Cowperthwaite et al. |
| 2013/0323542 A1* | 12/2013 | Wijayawardhana ........................ G01R 31/382 429/50 |
| 2014/0152261 A1 | 6/2014 | Yamauchi et al. |
| 2014/0302352 A1 | 10/2014 | Lenz et al. |
| 2016/0285137 A1 | 9/2016 | Gayden et al. |
| 2017/0016419 A1 | 1/2017 | Siekkinen et al. |
| 2018/0034037 A1 | 2/2018 | Zhang et al. |
| 2018/0034094 A1 | 2/2018 | Liu et al. |
| 2018/0287164 A1 | 10/2018 | Liu et al. |
| 2019/0067754 A1 | 2/2019 | Gu et al. |
| 2019/0157659 A1 | 5/2019 | Liu et al. |

FOREIGN PATENT DOCUMENTS

| | | |
|---|---|---|
| CN | 103390764 A | 11/2013 |
| CN | 203381507 U | 1/2014 |
| CN | 105097289 A | 11/2015 |
| CN | 204937019 U | 1/2016 |
| CN | 205178537 U | 4/2016 |
| CN | 107039711 A | 8/2017 |
| CN | 109427489 A | 3/2019 |
| CN | 109435672 A | 3/2019 |
| DE | 102018120481 A1 | 2/2019 |
| DE | 102018120484 A1 | 2/2019 |
| JP | 2010232265 A * | 10/2010 |
| WO | WO-2017206095 A1 | 12/2017 |
| WO | 2018132992 A1 | 7/2018 |

OTHER PUBLICATIONS

First Office Action for Chinese Patent Application No. 20170735511.1 dated Mar. 3, 2020 with English language machine translation, 23 pages.

Gu, Wentian et al., U.S. Appl. No. 16/110,644, filed Aug. 23, 2018 entitled "Supercapacitor Control Systems and Methods," 43 pages.

* cited by examiner

SYSTEMS AND METHODS FOR MONITORING OF A HYBRID ENERGY STORAGE DEVICE

CROSS-REFERENCE TO RELATED APPLICATIONS

This application claims the benefit and priority of Chinese Patent Application No. 201710736033.6 filed Aug. 24, 2017. The entire disclosure of the above application is incorporated herein by reference.

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to hybrid vehicle energy storage systems and more particularly to systems and methods for controlling energy storage devices including a combination of batteries and supercapacitors.

High-energy density, electrochemical cells, such as lithium-ion batteries, can be used in a variety of consumer products and vehicles. A stack of lithium-ion batteries may be electrically connected to such that the stack provides a greater overall output than the individual lithium-ion batteries.

A lithium-ion battery typically includes a first electrode, a second electrode, an electrolyte material, and a separator. One electrode serves as a positive electrode (or cathode), and another electrode serves as a negative electrode or anode. The separator and the electrolyte material are disposed between the first and second electrodes. The electrolyte conducts lithium ions and may be in solid or liquid form. Lithium ions move from a cathode (positive electrode) to an anode (negative electrode) during charging. Lithium ions move from the anode (negative electrode) to the cathode (positive electrode) during discharging.

SUMMARY

In a feature, a battery and supercapacitor system of a vehicle is described. The battery and supercapacitor system may include a lithium ion battery (LIB) having first and second electrodes. The system may also include a supercapacitor having third and fourth electrodes. Further, the system may include a first reference electrode disposed between the first and second electrodes and configured to measure a first potential at a first location between the first and second electrodes. A second reference electrode may be disposed between the third and fourth electrodes and configured to measure a second potential at a second location between the third and fourth electrodes. The first electrode may be connected to the third electrode and the second electrode may be connected to the fourth electrode. The first reference electrode may not be connected to any of the first, second, third, and fourth electrodes; and the second reference electrode may not be connected to any of the first, second, third, and fourth electrodes.

In another feature, a system is provided. The system may include the foregoing battery and supercapacitor system. In addition, the system may include a diagnostic module. The diagnostic module may be connected to the first reference electrode, a first node connected between the first and third electrodes, a second node connected between the second and fourth electrodes, and the second reference electrode. In addition, the diagnostic module may be configured to diagnose a fault in the LIB and/or the supercapacitor based on at least two of: the first potential, the second potential, a third potential at the first node, and a fourth potential at the second node.

In one example of the foregoing feature, the diagnostic module may be configured to diagnose the fault in the LIB and/or supercapacitor based on a comparison of: (i) one of the first potential, the second potential, the third potential, and the fourth potential with (ii) another one of the first potential, the second potential, the third potential, and the fourth potential.

In another example of the foregoing feature, the diagnostic module may be configured to diagnose the fault in the at least one of the LIB and the supercapacitor based on a comparison of: (i) one of the third potential and the fourth potential with (ii) one of the first potential and the second potential.

In yet another example of the foregoing feature, the battery and supercapacitor system may further include: a first current sensor between the first electrode and the first node and configured to measure a first current through the first electrode; a second current sensor between the first node and the third electrode and configured to measure a second current through the third electrode; a third current sensor between the second electrode and the second node and configured to measure a third current through the second electrode; and a fourth current sensor between the second node and the fourth electrode and configured to measure a fourth current through the fourth electrode. The diagnostic module may be connected to the first, second, third, and fourth current sensors. Additionally, the diagnostic module may be further configured to diagnose a fault in the LIB and/or supercapacitor based on at least one of the first, second, third, and fourth currents.

In one feature, the battery and supercapacitor system may also include a third reference electrode disposed between the second and third electrodes and configured to measure a fifth potential at a third location between the second and third electrodes. The third reference electrode may not be connected to any of the first, second, third, and fourth electrodes.

In one example of the foregoing feature, a system is provided. The system may include the foregoing battery and supercapacitor system. In addition, the system may include a diagnostic module. The diagnostic module may be connected to the first reference electrode, a first node connected between the first and third electrodes, the third reference electrode, a second node connected between the second and fourth electrodes, and the second reference electrode. The diagnostic module may be configured to diagnose a fault the LIB and/or supercapacitor based on at least two of: the first potential, the second potential, a third potential at the first node, a fourth potential at the second node, and the fifth potential.

In one example of the foregoing feature, the diagnostic module may be configured to diagnose the fault in the LIB and/or supercapacitor based on a comparison of: (i) one of the first potential, the second potential, the third potential, the fourth potential, and the fifth potential with (ii) another one of the first potential, the second potential, the third potential, the fourth potential, and the fifth potential.

In another example of the foregoing feature, the diagnostic module may be configured to diagnose the fault in the LIB and/or supercapacitor based on a comparison of: (i) one of the third potential and the fourth potential with (ii) one of the first potential, the second potential, and the fifth potential.

In yet another example of the foregoing feature, the battery and supercapacitor system may further include: a first current sensor between the first electrode and the first node and configured to measure a first current through the first electrode; a second current sensor between the first node and the third electrode and configured to measure a second current through the third electrode; a third current sensor between the second electrode and the second node and configured to measure a third current through the second electrode; and a fourth current sensor between the second node and the fourth electrode and configured to measure a fourth current through the fourth electrode. The diagnostic module may be connected to the first, second, third, and fourth current sensors. Additionally, the diagnostic module may be further configured to diagnose a fault in at least one of the LIB and the supercapacitor based on at least one of the first, second, third, and fourth currents.

In one feature of the battery and supercapacitor system, the LIB may include fifth and sixth electrodes and the supercapacitor may include seventh and eighth electrodes. The third and fourth electrodes of the supercapacitor may be disposed between: (i) the first and second electrodes of the LIB and (ii) the fifth and sixth electrodes of the LIB. In addition, the fifth and sixth electrodes of the LIB may be disposed between: (i) the third and fourth electrodes of the supercapacitor and (ii) the seventh and eighth electrodes of the supercapacitor.

In one example of the foregoing feature, the battery and supercapacitor system may also include: (i) a third reference electrode disposed between the second and third electrodes and configured to measure a fifth potential at a third location between the second and third electrodes and (ii) a fourth reference electrode disposed between the fourth and fifth electrodes and configured to measure a sixth potential at a fourth location between the fourth and fifth electrodes. The third reference electrode may not be connected to any of the first, second, third, and fourth electrodes. Similarly, the fourth reference electrode may not be connected to any of the first, second, third, fourth, fifth, sixth, seventh, and eighth electrodes.

In another example of the foregoing feature, a system is provided. The system may include the foregoing battery and supercapacitor system. In addition, the system may include a diagnostic module. The diagnostic module may be connected to the first reference electrode, a first node connected between the first and third electrodes, the third reference electrode, a second node connected between the second and fourth electrodes, the second reference electrode, and the fourth reference electrode. The diagnostic module may be configured to diagnose a fault in at least one of the LIB and the supercapacitor based on at least two of: the first potential, the second potential, a third potential at the first node, a fourth potential at the second node, the fifth potential, and the sixth potential.

In one example of the foregoing feature, the diagnostic module may be configured to diagnose the fault in the LIB and/or supercapacitor based on a comparison of: (i) one of the first potential, the second potential, the third potential, the fourth potential, the fifth potential, and the sixth potential with (ii) another one of the first potential, the second potential, the third potential, the fourth potential, the fifth potential, and the sixth potential.

In another example of the foregoing feature, the diagnostic module may be configured to diagnose the fault in the LIB and/or supercapacitor based on a comparison of: (i) one of the third potential and the fourth potential with (ii) one of the first potential, the second potential, the fifth potential, and the sixth potential.

In a feature of the battery and supercapacitor system, the first electrode includes lithium manganese oxide (LMO) and the second electrode includes lithium titanium oxide (LTO).

In another feature, the third and fourth electrodes include at least one of activated carbon, conductive polymer, and metal oxide.

In one feature, at least one of the first and second reference electrodes includes at least one of Li metal, Li plated metal wires, Li based alloy, lithium iron phosphate (LFP) and lithium titanium oxide.

In a feature, at least one of the first and second electrodes includes at least one of lithium nickel manganese cobalt oxide (NMC), lithium manganese oxide (LMO), lithium iron phosphate (LFP), graphite, and lithium titanium oxide (LTO).

In another feature, at least one of the first, second, third, and fourth current sensors has an accuracy in at least one of the following ranges: (i) 1 micro amp-1 amp and (ii) 1 milliamp-100 amps.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
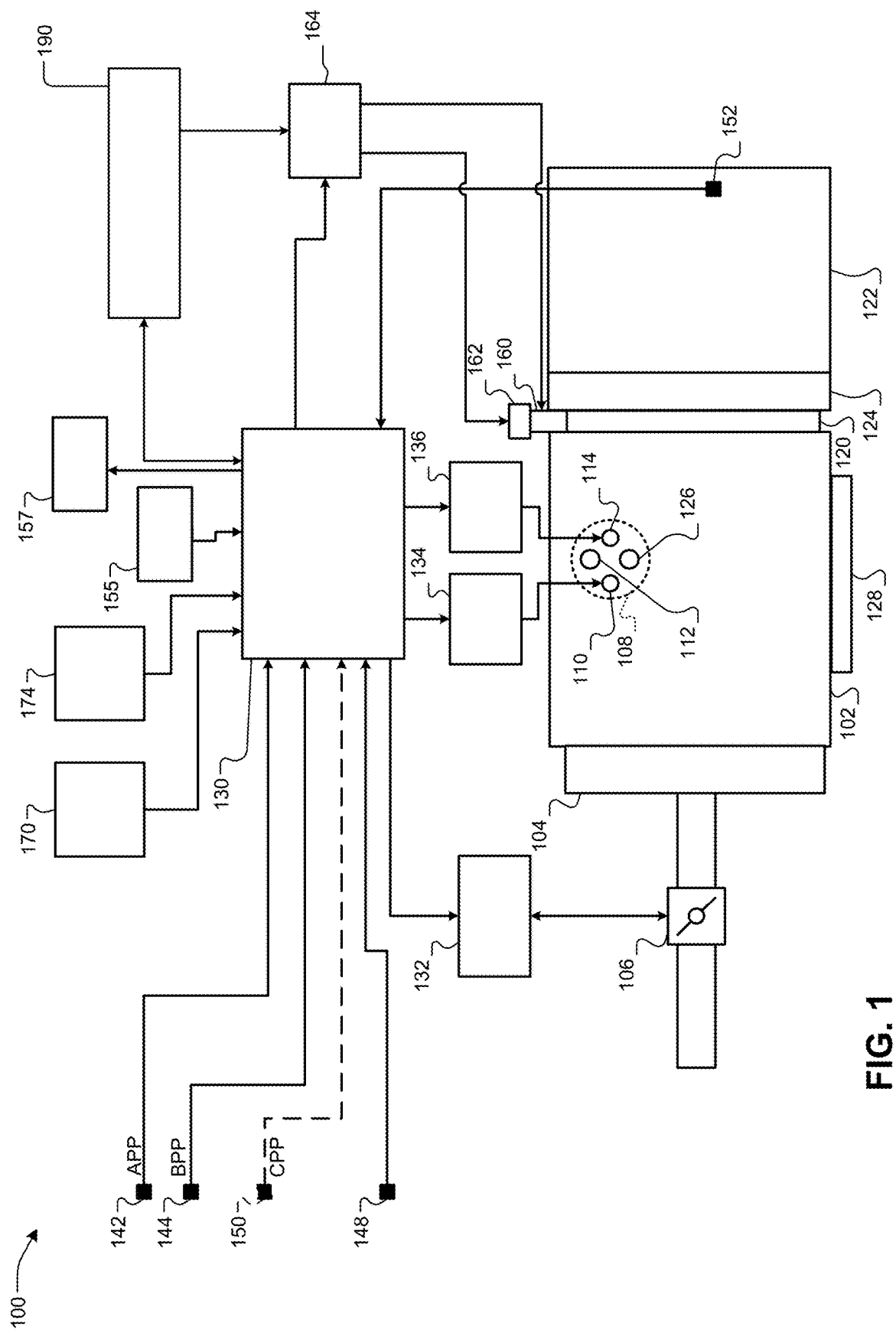
FIG. 1 if a functional block diagram of an example vehicle system.

A vehicle may include a lithium-ion battery (LIB) having one or more layers. A first component supplier may supply the LIB. The vehicle may also include a supercapacitor connected with the LIB. The supercapacitor may also include one or more layers. The supercapacitor may be used, for example, to supply current to a starter during engine startup and to limit current draw from the LIB for engine startup. However, supercapacitors self-discharge and, therefore, may draw power from the LIB when the LIB is not receiving power (e.g., via regenerative braking or via an alternator).

A second component supplier may supply the supercapacitor. A vehicle manufacturer or a third component supplier may integrate the LIB together with the supercapacitor. According to the present disclosure, the supercapacitor and the LIB include the same electrolyte and are implemented together within a housing. This may reduce a cost of the package including the supercapacitor and the LIB.

The supercapacitor and the LIB are connected in parallel. One or more switches are configured to allow the supercapacitor to be disconnected from the LIB.

A control module disconnects the supercapacitor from the LIB under no load or low load conditions. This prevents the supercapacitor from overly depleting charge from the LIB. For example, the control module may disconnect the supercapacitor when the engine has been off for a predetermined period, when an ignition key is not present in an ignition switch, or when driver input to shut down the engine (e.g., via an ignition key or button) is received. Additionally or alternatively, the control module may disconnect the supercapacitor when the driver leaves the driver's seat of the vehicle while the engine is off or when an object (e.g., key fob, mobile electronic device) leaves a predetermined area around the vehicle while the engine is off.

The control module connects the supercapacitor with the LIB for startup of the engine. For example, the control module may connect the supercapacitor when an ignition key is inserted into the ignition switch, when the object (e.g., key fob, mobile electronic device) enters the predetermined area, when the driver sits on the driver's seat of the vehicle, or when driver input to start the engine (e.g., via an ignition key or button) is received.

In addition, reference electrodes may be included between the electrodes of the LIB or supercapacitor. The reference electrodes may be configured to measure one or more potentials at one or more locations within the LIB and supercapacitor battery system. Further, current sensors may be included between various electrodes of the battery and supercapacitor system. The current sensors may be configured to measure one or more currents through various locations and/or components within the battery and supercapacitor system.

A diagnostic module may be connected to the reference electrodes and/or current sensors. The diagnostic module may be configured to diagnose a fault in the LIB and/or supercapacitor based on potential and current measurements obtained from the reference electrodes and currents sensors, respectively.

Referring now to FIG. 1, a functional block diagram of an example vehicle system 100 is presented. An engine 102 combusts an air/fuel mixture to produce drive torque for a vehicle. Air is drawn into an intake manifold 104 through a throttle valve 106. The throttle valve 106 regulates air flow into the intake manifold 104. Air within the intake manifold 104 is drawn into one or more cylinders of the engine 102, such as cylinder 108.

One or more fuel injectors, such as fuel injector 110, inject fuel that mixes with air to form an air/fuel mixture. In various implementations, one fuel injector may be provided for each cylinder of the engine 102. The fuel injectors may be associated with an electronic or mechanical fuel injection system, a jet or port of a carburetor, or another fuel injection system. The fuel injectors may be controlled to provide a desired air/fuel mixture for combustion, such as a stoichiometric air/fuel mixture.

An intake valve 112 opens to allow air into the cylinder 108. A piston (not shown) compresses the air/fuel mixture within the cylinder 108. In some engine systems, a spark plug 114 initiates combustion of the air/fuel mixture within the cylinder 108. In other types of engine systems, such as diesel engine systems, combustion may be initiated without the spark plug 114.

Combustion of the air/fuel mixture applies force to the piston, which rotatably drives a crankshaft (not shown). The engine 102 outputs torque via the crankshaft. A flywheel 120 is coupled to the crankshaft and rotates with the crankshaft. Torque output by the engine 102 is selectively transferred to a transmission 122 via a torque transfer device 124. More specifically, the torque transfer device 124 selectively couples the transmission 122 to the engine 102 and de-couples the transmission 122 from the engine 102. The torque transfer device 124 may include, for example, a torque converter and/or one or more clutches. The transmission 122 may include, for example, a manual transmission, an automatic transmission, a semi-automatic transmission, an auto-manual transmission, or another suitable type of transmission.

Exhaust produced by combustion of the air/fuel mixture is expelled from the cylinder 108 via an exhaust valve 126. The exhaust is expelled from the cylinders to an exhaust system 128. The exhaust system 128 may treat the exhaust before the exhaust is expelled from the exhaust system 128. Although one intake and exhaust valve are shown and described as being associated with the cylinder 108, more than one intake and/or exhaust valve may be associated with each cylinder of the engine 102.

An engine control module (ECM) 130 controls the torque output of the engine 102. For example only, the ECM 130 may control the torque output of the engine 102 via various engine actuators. The engine actuators may include, for example, a throttle actuator module 132, a fuel actuator module 134, and a spark actuator module 136. The engine 102 may also include one or more other engine actuators, and the ECM 130 may control the other engine actuators.

Each engine actuator controls an operating parameter based on a signal from the ECM 130. For example only, based on respective signals from the ECM, the throttle actuator module 132 may control opening of the throttle valve 106, the fuel actuator module 134 may control amount and timing of fuel injection, and the spark actuator module 136 may control spark timing.

The ECM 130 may control the torque output of the engine 102 based on, for example, driver inputs and various other inputs. The other inputs may include, for example, inputs from a transmission system, inputs from a hybrid control system, inputs from a stability control system, inputs from a chassis control system, and other suitable vehicle systems.

The driver inputs may include, for example, an accelerator pedal position (APP), a brake pedal position (BPP), and vehicle operation commands. An APP sensor 142 measures position of an accelerator pedal (not shown) and generates the APP based on the position of the accelerator pedal. A BPP sensor 144 measures position of a brake pedal (not shown) and generates the BPP based on the position of the brake pedal.

The vehicle operation commands may be made via actuation of, for example, an ignition key, one or more ignition buttons/switches, and/or one or more suitable vehicle ignition system inputs 148. In vehicles having a manual transmission, the driver inputs provided to the ECM 130 may also include a clutch pedal position (CPP). A CPP sensor 150 measures position of a clutch pedal (not shown) and generates the CPP based on the position of the clutch pedal.

In some implementations, the APP sensor 142, the BPP sensor 144, and the CPP sensor 150 may measure the position of the associated pedal and generate the APP, the BPP, and the CPP signals, respectively, based on the measured position of the associated pedal. In other implementations, the APP sensor 142, the BPP sensor 144, and the CPP sensor 150 may each include one or more switches and may generate the APP, the BPP, and the CPP, respectively, indicating whether the associated pedal is being actuated away from a predetermined resting position. While the APP sensor 142, the BPP sensor 144, and the CPP sensor 150 are shown and described, one or more additional APP, BPP, and/or CPP sensors may be provided.

A vehicle speed sensor 152 measures speed of the vehicle and generates a vehicle speed signal. For example only, the vehicle speed sensor 152 may generate the vehicle speed based on a transmission output shaft speed (TOSS), one or more wheel speeds, and/or another suitable measure of the vehicle speed. The ECM 130 may also receive operating parameters measured by other sensors 155, such as oxygen in the exhaust, engine speed, engine coolant temperature, intake air temperature, mass air flowrate, oil temperature, manifold absolute pressure, and/or other suitable parameters. According to some examples, a malfunction indicator light (MIL) 157 may be connected to the ECM 130. The ECM 130 may signal the MIL 157 to illuminate upon detection of a fault in the vehicle system 100. For example, in some implementations, the MIL 157 may be illuminated in response to a diagnosis (e.g., by a diagnostic module, such as diagnostic module 185 shown in FIG. 2) of a fault in the battery and supercapacitor system 190.

The ECM 130 selectively shuts down the engine 102 when a vehicle shutdown command (e.g., the ignition key or button is transitioned to OFF), is received. For example only, the ECM 130 may disable the injection of fuel, disable the provision of spark, and perform other engine shutdown operations to shut down the engine 102 when a vehicle shutdown command is received.

When a vehicle startup command (e.g., the ignition key is transitioned to ON) is received, a starter actuator module 164 actuates a starter motor actuator 162, such as a solenoid. Actuation of the starter motor actuator 163 engages a starter motor 160 with the engine 102. The starter motor 160 may engage the flywheel 120 or another suitable component that drives rotation of the crankshaft.

The starter actuator module 164 also applies power (current) to the starter motor 160 when the vehicle startup command is received. For example only, the starter actuator module 164 may include a starter relay. Application of power to the starter motor 160 drives rotation of the starter motor 160. Rotation of the starter motor 160 drives rotation of the engine 102. Driving rotation of the crankshaft to start the engine 102 may be referred to as engine cranking.

The starter motor 160 may automatically disengage the engine 102 or the starter motor actuator 162 may disengage the starter motor 160 from the engine 102 when an engine speed is greater than a predetermined speed. The starter actuator module 164 discontinues the current flow to the starter motor 160 when the engine speed is greater than the predetermined speed. For example only, the predetermined speed may be approximately 700 rpm or another suitable speed. Current is provided to the starter motor 160 by a battery and supercapacitor system 190, which is discussed further below.

While the example of vehicle startup and vehicle shutdown commands is provided, the engine 102 may also be started and shut down for auto-stop/start events and/or other events. The ECM 130 may shut down the engine 102 for the auto-stop portion of an auto-stop/start event when one or more predetermined auto-stop criteria are satisfied and vehicle shutdown has not been commanded (e.g., while the ignition key remains ON). The ECM 130 starts the engine 102 for the auto-start portion of an auto-stop/start event when one or more predetermined auto-start criteria are satisfied and vehicle startup has not been commanded. The ECM 130 may initiate auto stop events and auto start events, for example, based on the APP, the BPP, the vehicle speed, the CPP, one or more parameters of the battery and supercapacitor system 190, and/or one or more other suitable parameters. For example only, the ECM 130 may initiate an auto-stop event when the brake pedal is depressed and the vehicle speed is less than a predetermined speed. While the engine 102 is shut down for the auto stop event, the ECM 130 may selectively initiate an auto start event when the brake pedal is released.

In various implementations, the vehicle may include a passive entry module 170. The passive entry module 170 communicates wirelessly via one or more antennas and wirelessly detects the presence of an object within a predetermined distance of the vehicle. The object may include, for example, a key fob, a mobile device (e.g., cellular phone, tablet, etc.). The passive entry module 170 may unlock of doors of the vehicle and/or perform one or more other actions when the object is detected within the predetermined distance of the vehicle.

The vehicle may include a driver's seat sensor 174 that measures pressure applied to a seating surface of a driver's seat of the vehicle. The driver's seat sensor 174 may be implemented, for example, below or within the driver's seat. When the pressure applied to the seating surface of the driver's seat is greater than a predetermined pressure, the ECM 130 (or another module) may determine that a driver is seated on the driver's seat.

Figure 2:
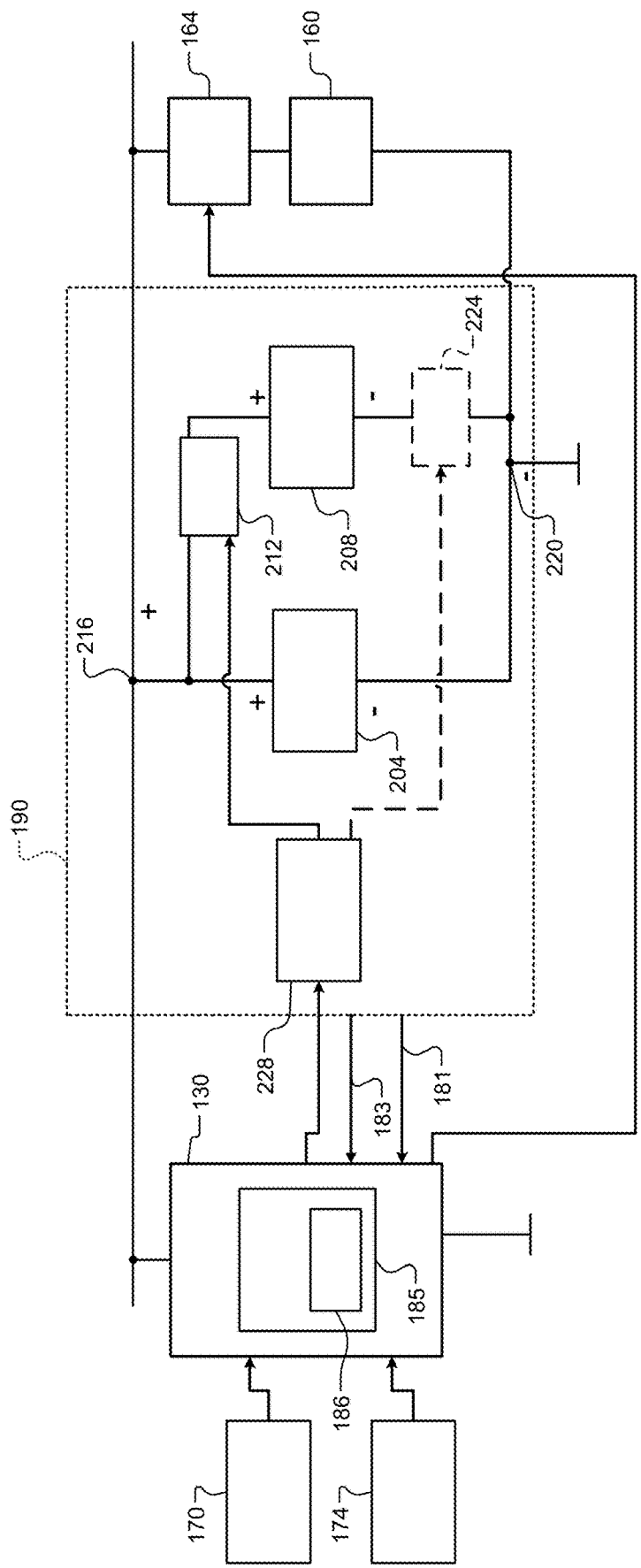
FIG. 2 is a functional block diagram including an example battery and supercapacitor system.

Referring now to FIG. 2, a functional block diagram including the battery and supercapacitor system 190 is presented. The battery and supercapacitor system 190 includes a lithium ion battery (LIB) 204, a supercapacitor 208, and a first switch 212. Supercapacitors can also be referred to as ultracapacitors. While the example of the battery and supercapacitor system 190 including a single layer LIB and a single layer supercapacitor is shown in FIG. 2, as discussed further below, the battery and supercapacitor system 190 may include a LIB having two or more layers and/or a supercapacitor having two or more layers.

A first portion (e.g., a first electrode) of the LIB 204 is connected to a positive node 216. A second portion (e.g., a second electrode) of the LIB 204 is connected to a negative node 220. The first switch 212 is configured to connect and disconnect a first portion (e.g., a first electrode) of the supercapacitor 208 to and from the positive node 216. A second portion (e.g., a second electrode) of the supercapacitor 208 may be connected to the negative node 220. In various implementations, a second switch 224 may be included where the second switch 224 is configured to connect and disconnect the second portion of the supercapacitor 208 to and from the negative node 220. A direct current (DC) to DC (DC/DC) converter is not needed (and is therefore not included) between the supercapacitor 208 and the positive and negative nodes 216 and 220.

To start the engine 102, the starter actuator module 164 applies power from the positive and negative nodes 216 and 220 to the starter motor 160. For example, the starter motor 160 may be directly connected to the negative node 220. The starter actuator module 164 may connect the starter motor 160 to the positive node 216, thereby applying power to the starter motor 160, for startup of the engine 102.

A switch control module 228 controls switching of the first switch 212. In implementations that also include the second switch 224, the switch control module 228 also controls switching of the second switch 224. The first switch 212 and the second switch 224 are break (open) under no load switches and are configured to be able to opened by the switch control module 228 (e.g., only) when current through the switch(es) is less than a predetermined current. In various implementations, the switch control module 228 may only open the first and second switches 212 and 224 when current is less than the predetermined current. The current may be measured using a current sensor. For example only, the predetermined current may be 10 milliamps (mA), 50 mA, 100 mA, or another suitable current indicative of the starter motor 160 not drawing current from the battery and supercapacitor system 190. The first and second switches 212 and 224 may be, for example, insulated gate bipolar transistors (IGBTs) or another suitable type of switch.

The switch control module 228 closes the first and second switches 212 and 224 before or for startup of the engine 102. For example, the switch control module 228 closes the first and second switches 212 and 224 in response to receipt of a vehicle startup command via user actuation of an ignition key, button, or switch while the vehicle is off. Additionally or alternatively, the switch control module 228 may close the first and second switches 212 and 224 in response to insertion of the ignition key into an ignition switch of the vehicle. Additionally or alternatively, the switch control module 228 may close the first and second switches 212 and 224 in response to the pressure measured by the driver's seat sensor 174 transitioning from less than a predetermined pressure to greater than the predetermined pressure. The pressure measured by the driver's seat sensor 174 transitioning from less than the predetermined pressure to greater than the predetermined pressure may indicate that a driver has sat down on the driver's seat. The predetermined pressure may be calibrated and may be greater than zero. Additionally or alternatively, the switch control module 228 may close the first and second switches 212 and 224 in response to a signal from the passive entry module 170 indicating that the object is within the predetermined distance of the vehicle. In various implementations, the switch control module 228 may receive the signal from the passive entry module 170 and the pressure from the driver's seat sensor from another module (e.g., the ECM 130) and/or a network, such as a controller area network (CAN) or another type of network.

The switch control module 228 maintains the first and second switches 212 and 224 closed until opening the first and second switches 212 and 224. After closing the first and second switches 212 and 224, the switch control module 228 may next open the first and second switches 212 and 224, for example, when the engine speed is zero (i.e., the engine 102 is shut down). Additionally or alternatively, the switch control module 228 may open the first and second switches 212 and 224 in response to receipt of a vehicle shutdown command via user actuation of an ignition key, button, or switch while the vehicle is on. Additionally or alternatively, the switch control module 228 may open the first and second switches 212 and 224 in response to removal of the ignition key into an ignition switch of the vehicle. Additionally or alternatively, the switch control module 228 may open the first and second switches 212 and 224 when the engine 102 has been shut down for at least a predetermined period. The predetermined period is greater than zero and may be calibratable. For example only, the predetermined period may be 5 minutes or another suitable period. Additionally or alternatively, the switch control module 228 may open the first and second switches 212 and 224 in response to the pressure measured by the driver's seat sensor 174 transitioning from greater than the predetermined pressure to less than the predetermined pressure. The pressure measured by the driver's seat sensor 174 transitioning from greater than the predetermined pressure to less than the predetermined pressure may indicate that the driver has left the driver's seat. Additionally or alternatively, the switch control module 228 may open the first and second switches 212 and 224 in response to the signal from the passive entry module 170 indicating that the object has left the predetermined distance of the vehicle.

While the example of the switch control module 228 controlling the first and second switches 212 and 224 is discussed above, the switch control module 228 may control only the first switch 212 or only the second switch 224 as discussed above.

According to some implementations, the ECM 130 may include a diagnostic module 185. While shown as part of the ECM 130 in FIG. 2, according to some examples, the diagnostic module 185 may be separate and distinct from the ECM 130. The diagnostic module 185 may include memory 186.

The diagnostic module 185 may be configured to selectively diagnose the presence of a fault associated with the battery and supercapacitor system 190. For example, the diagnostic module 185 may receive potential measurements 183 and current measurements 181 from the battery and supercapacitor system 190. More specifically, the diagnostic module 185 may receive potential measurements 183 from one or more reference electrodes and current measurements 181 from one or more current sensors. The diagnostic module 190 may diagnose a fault, for example, when the potential measurements 183 and/or current measurements 181 fall outside of a predetermined range. In some examples, the diagnostic module 190 may diagnose a fault when the relationship between select potential measurements 183 and select current measurements 181 falls outside of a predetermined range.

The diagnostic module 185 may take one or more remedial actions when a fault is diagnosed. For example, the diagnostic module 185 may store a predetermined diagnostic trouble code (DTC) in memory 186 when a fault associated with the battery and supercapacitor system 190 is diagnosed. In some examples, the diagnostic module 185 may also monitor the memory 186 and illuminate a MIL (e.g., the MIL 157 of FIG. 1) within a passenger cabin of the vehicle when one or more DTCs are stored in the memory 186. The MIL may visually indicate to drivers to seek vehicle service. The predetermined DTC may indicate, to a vehicle service technician for example, the presence of a fault associated with the battery and supercapacitor system 190.

Figure 3:
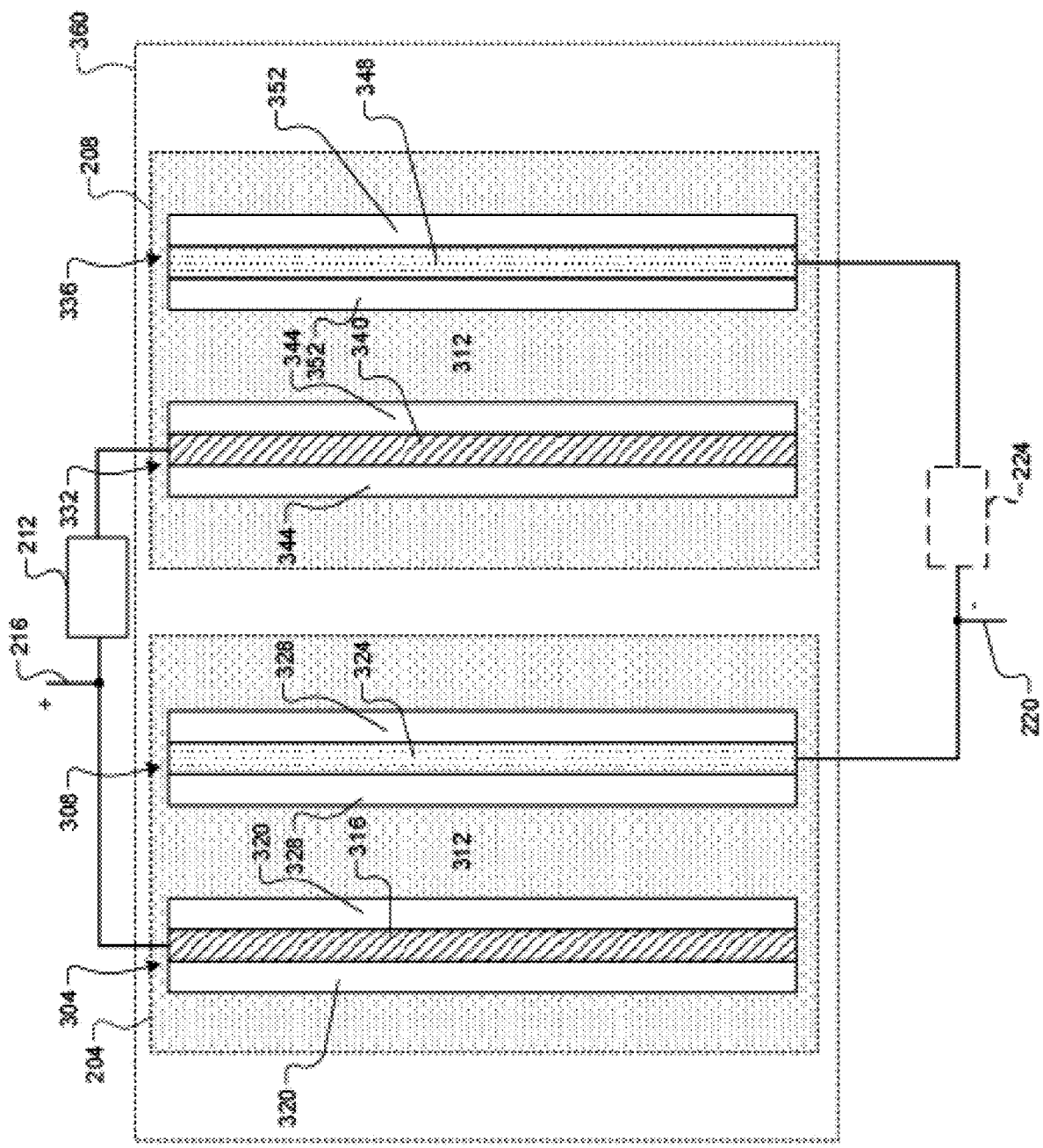
FIGS. 3-4 include example diagrams including a single layer Lithium ion battery (LIB) and a single layer supercapacitor.
Figure 4:
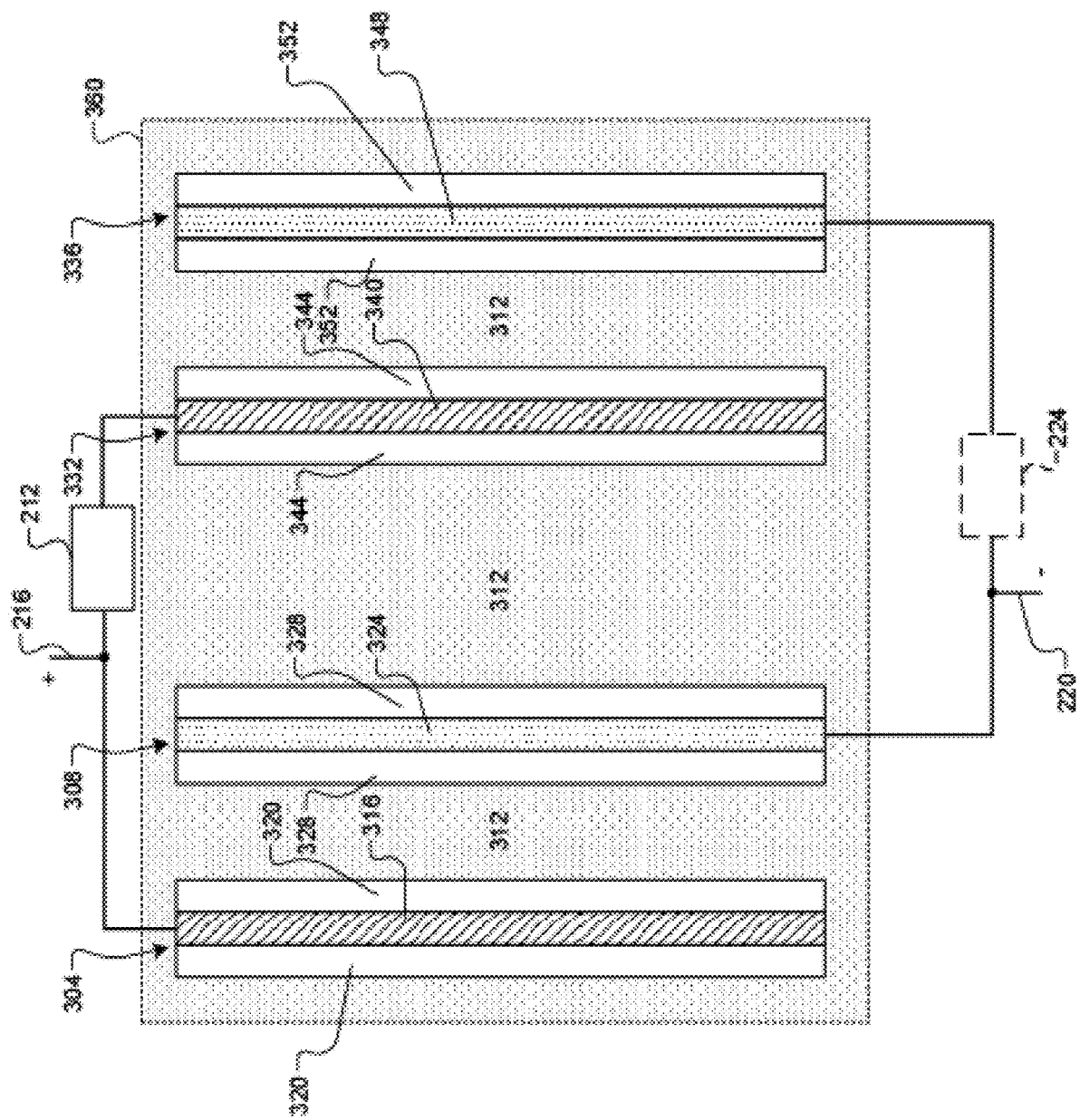

FIGS. 3 and 4 are example diagrams including the LIB 204 as a single layer LIB and the supercapacitor 208 as a single layer supercapacitor. The LIB 204 includes a first electrode 304, a second electrode 308, and an electrolyte 312. The single layer of the LIB 204 includes the first electrode 304 and the second electrode 308. The electrolyte 312 may be aqueous or non-aqueous. The electrolyte 312 may include, for example, one or more lithium salts and one or more solvents, such as one or more organic solvents. The electrolyte 312 may also include one or more other additives.

The first electrode 304 includes a first current conductor 316 and a first electrode material 320. The first electrode material 320 may be implemented on one or more sides or around the first current conductor 316. The first current conductor 316 may include, for example, aluminum or another suitable material. The first current conductor 316 is connected to the positive node 216. The first electrode material 320 may include, for example, lithium manganese oxide (LMO) or another suitable type of electrode material.

The second electrode 308 includes a second current conductor 324 and a second electrode material 328. The second electrode material 328 may be implemented on one or more sides or around the second current conductor 324. The second current conductor 324 may include, for example, copper or another suitable material. The second current conductor 324 is connected to the negative node 220. The second electrode material 328 may include, for example, lithium titanium oxide (LTO) or another suitable type of electrode material. The first electrode 304, the second electrode 308, and the electrolyte 312 may be housed within a battery housing.

The supercapacitor 208 includes a first electrode 332, a second electrode 336, and the electrolyte 312. The single layer of the supercapacitor 208 includes the first electrode 332 and the second electrode 336. The electrolyte of the supercapacitor 208 is the same as the electrolyte included in the LIB 204. In various implementations, the electrolyte may be different than the electrolyte included in the LIB 204. The use of the same electrolyte may reduce an overall cost of the LIB 204 and the supercapacitor 208.

The first electrode 332 includes a first current conductor 340 and a first electrode material 344. The first electrode material 344 may be implemented on one or more sides or around the first current conductor 340. The first current conductor 340 may include, for example, aluminum or another suitable material. The first current conductor 316 may (or should) be the same material as the first current conductor 340. The first current conductor 340 is connected to the positive node 216 via the first switch 212. The first electrode material 344 may include, for example, activated carbon (AC) or another suitable type of electrode material.

The second electrode 336 includes a second current conductor 348 and a second electrode material 352. The second electrode material 352 may be implemented on one or more sides or around the second current conductor 348. The second current conductor 348 may include, for example, copper or another suitable material. The second current conductor 348 may (or should) be the same material as the second current conductor 324. The second current conductor 348 is connected to the negative node 220. The second current conductor 324 may be directly connected to the negative node 220 or connected to the negative node 220 via the second switch 224. The second electrode material 352 may include, for example, AC or another suitable type of electrode material. The second electrode material 352 may be the same as the first electrode material 344. The first electrode 332, the second electrode 336, and the electrolyte 312 may be housed within a supercapacitor housing.

The LIB 204 (including the battery housing) and the supercapacitor 208 (including the supercapacitor housing) may be implemented separately (i.e., isolated) in separate housings. In various implementations, the battery housing and the super capacitor housing may be implemented together within a common housing 360.

As shown in FIG. 4, because the LIB 204 and the supercapacitor 208 both utilize the electrolyte 312, the battery housing and the supercapacitor housing may be omitted. The first and second electrodes 304 and 308 of the LIB 204 may be disposed in the electrode 312 within the housing 360 along with the first and second electrodes 332 and 336 of the supercapacitor 208.

As stated above, while the example of a single layer LIB and a single layer supercapacitor is discussed above, the LIB may include multiple layers and/or the supercapacitor may include multiple layers. Layers of a multilayer LIB are connected in parallel. Layers of a multilayer supercapacitor are connected in parallel, and the supercapacitor electrodes are connected to the positive node 216 via the first switch 212 and/or the negative node 220 via the second switch 224.

Figure 5:
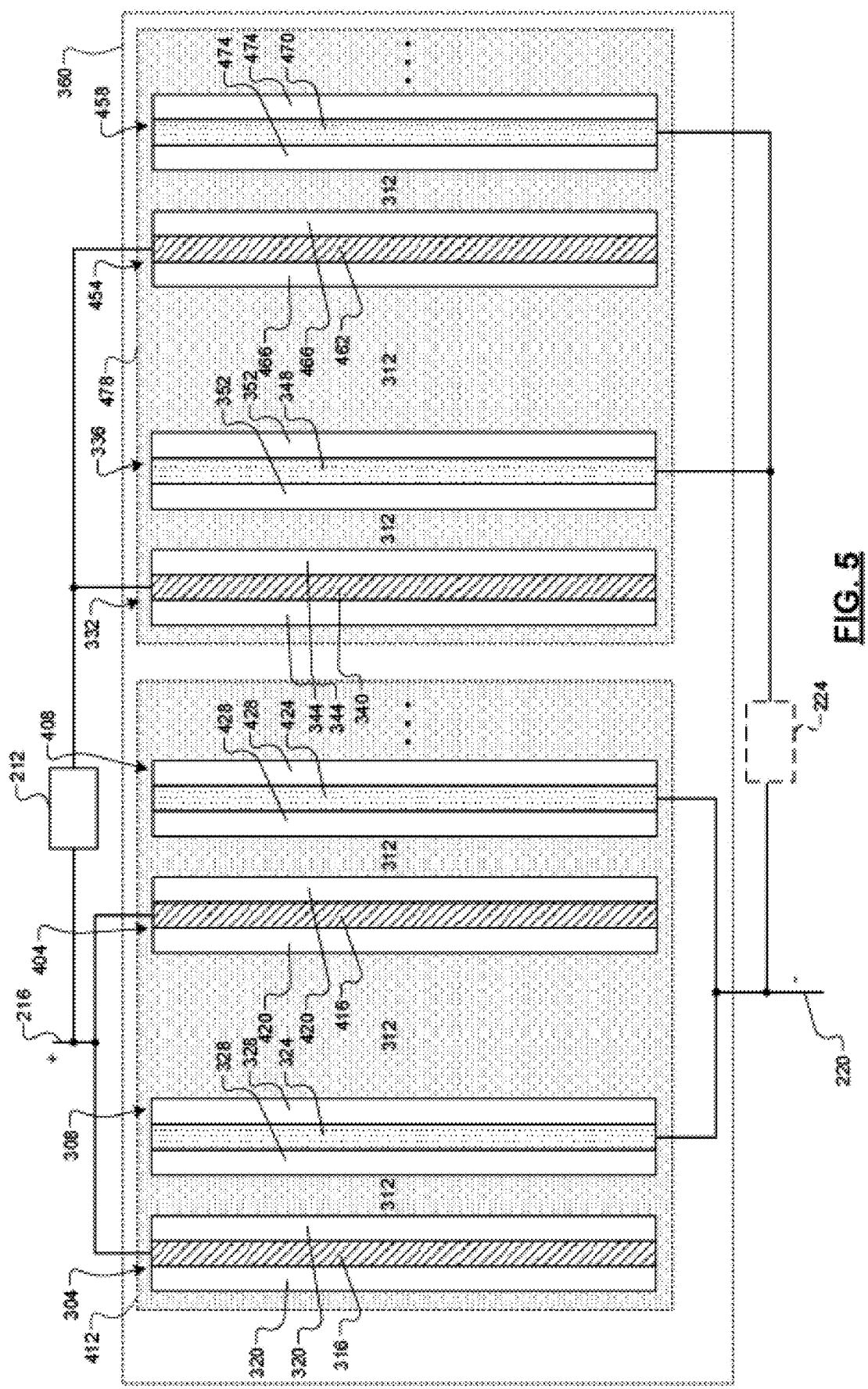
FIGS. 5-7 include example diagrams including a multilayer LIB and a multilayer supercapacitor.
Figure 6:
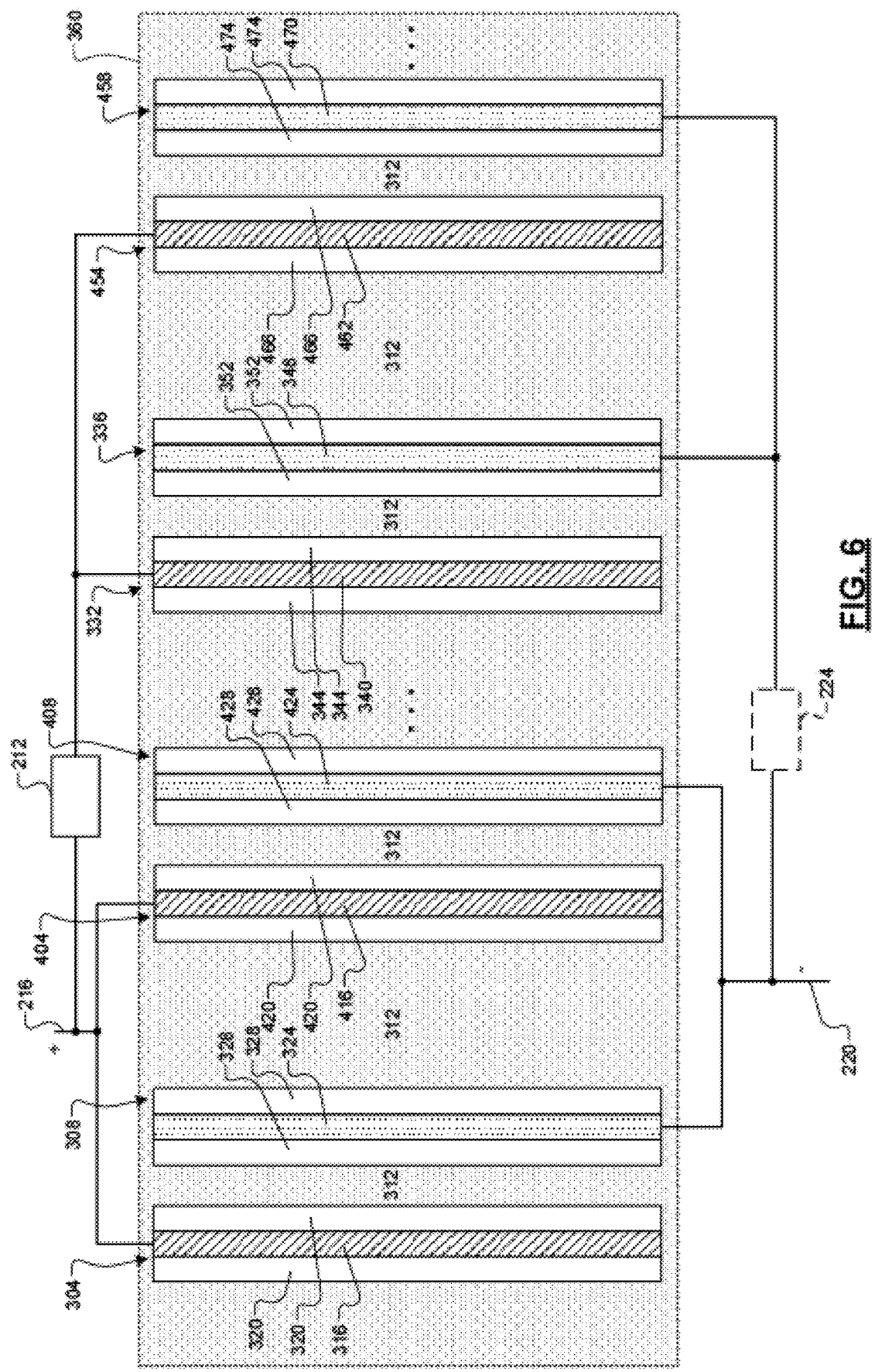

For example, FIGS. 5 and 6 are example diagrams including multilayer LIBs and multilayer supercapacitors. Each layer of an LIB includes a pair of electrodes. Each layer of a super capacitor includes a pair of electrodes. One or more additional layers of the LIB 204 may be connected in parallel. For example, a second pair of LIB electrodes may be connected in parallel with the electrodes of the LIB 204. The second pair of LIB electrodes includes a first electrode 404 and a second electrode 408.

The first electrode 404 includes a first current conductor 416 and a first electrode material 420. The first electrode material 420 may be implemented on one or more sides or around the first current conductor 416. The first current conductor 416 may include, for example, aluminum or another suitable material. The first current conductor 416 may be the same material as the first current conductor 316. The first current conductor 416 is connected to the first current conductor 316 and to the positive node 216. The first electrode material 420 may include, for example, LMO or another suitable type of electrode material. The first electrode material 420 may be the same material as the first electrode material 320.

The second electrode 408 includes a second current conductor 424 and a second electrode material 428. The second electrode material 428 may be implemented on one or more sides or around the second current conductor 424. The second current conductor 424 may include, for example, copper or another suitable material. The second current conductor 424 may be the same material as the second current conductor 324. The second current conductor 424 is connected to the second current conductor 324 and to the negative node 220. The second electrode material 428 may include, for example, LTO or another suitable type of electrode material. The second electrode material 428 may be the same material as the second electrode material 328.

While the example of the LIB 204 including two layers is shown, the LIB 204 may include one or more additional layers, as indicated by the ellipsis. The one or more additional layers are connected in parallel with the other layers of the LIB 204. The electrodes of all of the layers of the LIB 204 and the electrolyte may be housed within a battery housing 412.

Additionally or alternatively to the LIB 204 including multiple layers, the supercapacitor 208 may include multiple layers. For example, a second layer is connected in parallel with first layer of the supercapacitor 208. The second layer includes a first electrode 454 and a second electrode 458. In FIGS. 5 and 6, the electrolyte 312 of the supercapacitor 208 is the same as the electrolyte 312 included in the LIB 204. The use of the same electrolyte may reduce overall cost. The electrolyte of the supercapacitor 208, however, may be different than the electrolyte of the LIB 204.

The first electrode 454 includes a first current conductor 462 and a first electrode material 466. The first electrode material 466 may be implemented on one or more sides or around the first current conductor 462. The first current conductor 462 may include, for example, aluminum or another suitable material. The first current conductor 462 may be the same material as the first current conductor 340. The first current conductor 462 is connected to the positive node 216 via the first switch 212. The first electrode material 466 may include, for example, AC or another suitable type of electrode material. The first electrode material 466 may be the same material as the first electrode material 344.

The second electrode 458 includes a second current conductor 470 and a second electrode material 474. The second electrode material 474 may be implemented on one or more sides or around the second current conductor 470. The second current conductor 470 may include, for example, copper or another suitable material. The second current conductor 470 may be the same material as the second current conductor 324. The second current conductor 470 is connected to the second current conductor 324 and to the negative node 220. The second current conductor 470 may be directly connected to the negative node 220 or connected to the negative node 220 via the second switch 224. The second electrode material 474 may include, for example, AC or another suitable type of electrode material. The second electrode material 474 may be the same as the first electrode material 466.

While the example of the supercapacitor 208 including two layers is shown, the supercapacitor 208 may include one or more additional layers, as indicated by the ellipsis. The one or more additional layers are connected in parallel with the other layers of the supercapacitor 208. The electrodes of the supercapacitor 208 and the electrolyte 312 may be housed within a supercapacitor housing 478.

As shown in FIG. 6, however, because the LIB 204 and the supercapacitor 208 both utilize the electrolyte 312, the battery housing and the supercapacitor housing 478 may be omitted. The electrodes of the LIB 204 and the electrodes of the supercapacitor 208 may be disposed together in the electrolyte 312 within the housing 360.

Figure 7:
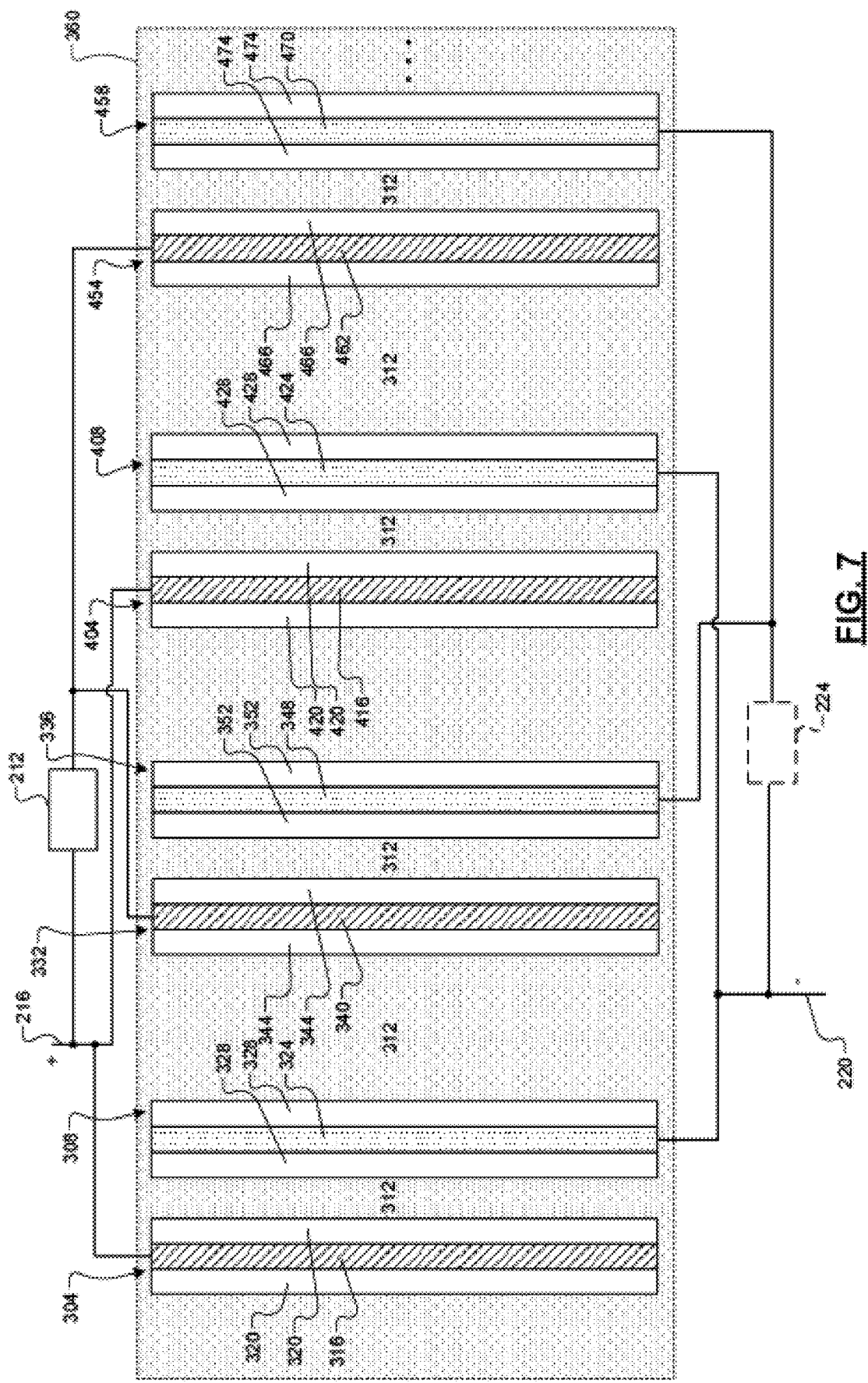

In various implementations, as shown in FIG. 7, electrodes of the supercapacitor 208 and electrodes of the LIB 204 may be intermixed. For example, a layer (including a pair of electrodes) of the supercapacitor 208 may be disposed between a layer (including a pair of electrodes) of the LIB 204, and/or a layer (including a pair of electrodes) of the LIB 204 may be disposed between a layer (including a pair of electrodes) of the supercapacitor 208. The intermixed structure could also be multiplied.

Figure 8:
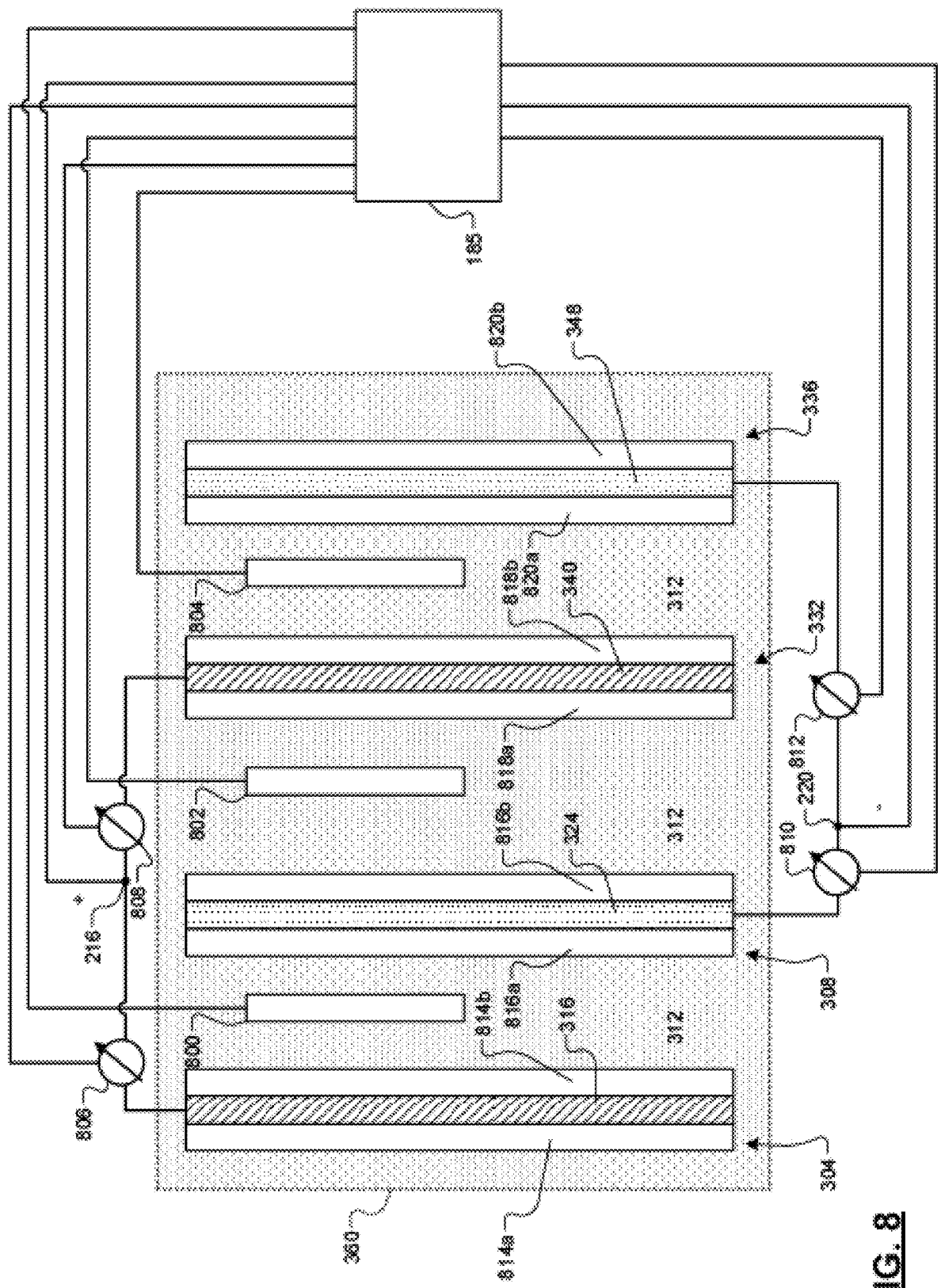
FIG. 8 includes an example diagram including a single layer LIB, a single layer supercapacitor, and a plurality of reference electrodes.

FIG. 8 illustrates an example implementation of a battery and supercapacitor system similar to that illustrated in FIG. 4. In the example shown in FIG. 8, the LIB 204 constitutes a single layer LIB and the supercapacitor 208 constitutes a single layer supercapacitor. The LIB 204 includes the first electrode 304, the second electrode 308, and the electrolyte 312. The single layer of the LIB 204 includes the first electrode 304 and the second electrode 308. The electrolyte 312 may be aqueous or non-aqueous. The electrolyte 312 may include, for example, one or more lithium salts and one or more solvents, such as one or more organic solvents. The electrolyte 312 may also include one or more other additives.

The first electrode 304 includes a first current conductor 316 sandwiched between a first layer of electrode material 814*a* and a second layer of electrode material 814*b*. The electrode material 814*a* and 814*b* may include, for example, lithium manganese oxide (LMO) or another suitable type of electrode material. The first current conductor 316 may include, for example, aluminum or another suitable material. The first current conductor 316 is connected to the positive node 216.

The second electrode 308 includes the second current conductor 324 sandwiched between a third layer of electrode material 816*a* and a fourth layer of electrode material 816*b*. The electrode material 816*a* and 816*b* may include, for example, lithium titanium oxide (LTO) or another suitable type of electrode material. The second current conductor 324 may include, for example, copper or another suitable material. The second current conductor 324 is connected to the negative node 220. The first electrode 304, the second electrode 308, and the electrolyte 312 may be housed within the battery and supercapacitor system housing 360.

According to some examples, the first electrode 304 and/or the second electrode 308 may additionally or alternatively include electrode material in the form of lithium nickel manganese cobalt oxide (NMC), LMO, lithium iron phosphate (LFP), LTO, graphite or the like without deviating from the teachings herein.

The supercapacitor 208 includes the first electrode 332, the second electrode 336, and the electrolyte 312. The single layer of the supercapacitor 208 includes the first electrode 332 and the second electrode 336. The electrolyte of the supercapacitor 208 is the same as the electrolyte included in the LIB 204. In various implementations, the electrolyte may be different than the electrolyte included in the LIB 204. The use of the same electrolyte may reduce an overall cost of the LIB 204 and the supercapacitor 208.

The first electrode 332 includes the first current conductor 340 sandwiched between a first layer of electrode material 818*a* and a second layer of electrode material 818*b*. The electrode material 818*a* and 818*b* may include, for example, AC or another suitable type of electrode material. The first current conductor 340 may include, for example, aluminum or another suitable material. The first current conductor 316 may (or should) be the same material as the first current conductor 340. The first current conductor 340 is connected to the positive node 216.

The second electrode 336 includes the second current conductor 348 sandwiched between a third layer of electrode material 820*a* and a fourth layer of electrode material 820*b*. The electrode material 820*a* and 820*b* may include, for example, AC or another suitable type of electrode material. The second current conductor 348 may include, for example, copper or another suitable material. The second current conductor 348 may (or should) be the same material as the second current conductor 324. The second current conductor 348 is connected to the negative node 220. The first electrode 332, the second electrode 336, and the electrolyte 312 may be housed within the battery and supercapacitor system housing 360.

According to some examples, the first electrode 332 and/or the second electrode 336 may additionally or alternatively include electrode material in the form of conductive polymer, metal oxide, or the like without deviating from the teachings herein.

Furthermore, and although not shown, according to some implementations, one or more of the current conductors 316, 324, 340, 348 may be connected to one or more switches, similar to the implementation illustrated in FIG. 4. For example, the first current conductor 340 may be connected to the positive node 216 via a first switch (e.g., the first switch 212) and/or the second current conductor 324 may be connected to the negative node 220 via a second switch (e.g., second switch 224).

As shown in FIG. 8, because the LIB 204 and the supercapacitor 208 both utilize the electrolyte 312, the battery housing and the supercapacitor housing may be omitted. The first and second electrodes 304 and 308 of the LIB 204 may be disposed in the electrolyte 312 within the housing 360 along with the first and second electrodes 332 and 336 of the supercapacitor 208.

FIG. 8 differs from FIG. 4 principally based on the inclusion of the following components within the system of FIG. 8 that are not included within the system of FIG. 4: (i) first, second, and third reference electrodes 800, 804, 802 within the housing 360, (ii) first second, third, and fourth current sensors 806, 808, 810, 812 connected to the current conductors 316, 324, 340, 348, and (iii) the diagnostic module 185.

As shown in FIG. 8, the housing 360 includes a first reference electrode 800 disposed between the first and second electrodes 304 and 308 of the LIB 204, a second reference electrode 804 disposed between the first and second electrodes 332 and 336 of the supercapacitor 208, and a third reference electrode 802 disposed between the second electrode 308 of the LIB 204 and the first electrode 332 of the supercapacitor 208.

The first reference electrode 800 is configured to measure a first potential at a location between the first and second electrodes 304 and 308 of the LIB 204. In addition, the first reference electrode 800 is not connected to any of (i) the first and second electrodes 304 and 308 of the LIB 204 or (ii) the first and second electrodes 332 and 336 of the supercapacitor 208. The second reference electrode 804 is configured to measure a second potential at a location between the first and second electrodes 332 and 336 of the supercapacitor 208. In addition, the second reference electrode 804 is not connected to any of (i) the first and second electrodes 304 and 308 of the LIB 204 or (ii) the first and second electrodes 332 and 336 of the supercapacitor 208. The third reference electrode 802 is configured to measure a third potential at a location between the second electrode 308 of the LIB 204 and the first electrode 332 of the supercapacitor 208. In addition, the third reference electrode 802 is not connected to any of (i) the first and second electrodes 304 and 308 of the LIB 204 or (ii) the first and second electrodes 332 and 336 of the supercapacitor 208.

The first, second, and third reference electrodes 800, 804, 802 may include Li metal, Li plated metal wires, Li based alloy, electrode material in the form of LFP, LTO, or another suitable electrode material. In addition, the reference electrodes 800, 802, and 804 may be connected to the diagnostic module 185 via suitable conductive material, such as copper, aluminum, or another suitable conductive material.

Generally speaking, the first, second, and third reference electrodes 800, 804, 802 are configured to facilitate operando (e.g., real-time) monitoring of the potential of all individual electrodes in a battery and supercapacitor system. Current measurements obtained from the current sensors 806, 808, 810, 812 (discussed in additional detail below) and/or the potential measurements obtained from the first, second, and third reference electrodes 800, 804, 802 may be utilized (e.g., by the diagnostic module 185) to (i) diagnose faults in the battery and supercapacitor system (e.g., indications of thermal runaway, overcharge, lithium plating, etc.), (ii) glean information concerning extended factors of the battery and supercapacitor system, such as capacity, power, etc., (iii) support battery and supercapacitor system design and modeling, and/or (iv) expedite the battery and supercapacitor system development process.

According to the example implementation illustrated in FIG. 8, the current sensors 806, 808, 810, and 812 may be connected to the current conductors 316, 324, 340, 348 to obtain current measurements through various components of the battery and supercapacitor system.

For example, the first current sensor 806 may be disposed between the first electrode 304 of the LIB 204 and the positive node 216. The first current sensor 806 may be configured to measure a first current through the first electrode 304. The second current sensor 808 may be disposed between the positive node 216 and the first electrode 332 of the supercapacitor 208. The second current sensor 808 may be configured to measure a second current through the first electrode 332. The third current sensor 810 may be disposed between the second electrode 308 of the LIB 204 and the negative node 220. The third current sensor 810 may be configured to measure a third current though the second electrode 308. The fourth current sensor 812 may be disposed between the negative node 220 and the second electrode 336 of the supercapacitor 208. The fourth current sensor 812 may be configured to measure a fourth current through the second electrode 336.

The first, second, third, and fourth current sensors 806, 808, 810, 812 may include Hall Effect sensors, current sensing resistors, or another suitable type of device that measures electric current (e.g., AC and/or DC current) in a conductive material and generates one or more signals corresponding to the measured current. The first, second, third, and fourth current sensors 806, 808, 810, 812 may be connected to the diagnostic module 185 via suitable conductive material, such as copper, aluminum, or any other suitable conductive material. According to some examples, one or more of the current sensors 806, 808, 810, 812 may accurately measure current between the following, non-exclusive, ranges: (1) 1 micro amp through 1 amp; and (2) 1 milliamp through 100 amps. Of course, the current sensors may, according to other examples, measure current with accuracy outside of the foregoing ranges without departing from the teachings of the instant disclosure.

The diagnostic module 185 is connected to the positive node 216, the negative node 220, the first, second, and third reference electrodes 800, 804, 802, and the first, second, third, and fourth current sensors 806, 808, 810, 812. The diagnostic module is configured to diagnose a fault in the LIB 204 and/or supercapacitor 208 based on potential and/or current measurements obtained from, for example, the positive and/or negative nodes 216, 220, the first, second, and third reference electrodes 800, 804, 802, and/or the first, second, third, and fourth current sensors 806, 808, 810, and 812.

According to some examples, the diagnostic module 185 is configured to diagnose a fault in the LIB 204 and/or the supercapacitor 208 based on at least two of: the potential measured by the first reference electrode 800, the potential measured by the second reference electrode 804, the potential measured by the third reference electrode 802, the potential at the positive node 216, and the potential at the negative node 220.

According to another example, the diagnostic module 185 is configured to diagnose a fault in the LIB 204 and/or the supercapacitor 208 based on a comparison of: (i) the potential measured by the first reference electrode 800, the potential measured by the second reference electrode 804, the potential measured by the third reference electrode 802, the potential at the positive node 216, and/or the potential at the negative node 220; with (ii) the potential measured by the first reference electrode 800, the potential measured by the second reference electrode 804, the potential measured by the third reference electrode 802, the potential at the positive node 216, and/or the potential at the negative node 220.

According to yet another example, the diagnostic module 185 is configured to diagnose a fault in the LIB 204 and/or the supercapacitor 208 based on a comparison of: (i) the potential at the positive node 216 and/or the potential at the negative node 220; with (ii) the potential measured by the first reference electrode 800, the potential measured by the second reference electrode 804, and/or the potential measured by the third reference electrode 802.

According to still another example, the diagnostic module 185 is configured to diagnose a fault in the LIB 204 and/or supercapacitor 208 based on the current measured by the first current sensor 806, the current measured by the second current sensor 808, the current measured by the third current sensor 810, and/or the current measured by the fourth current sensor 812.

In some example implementations, the diagnostic module 185 may be further configured to determine the potential at different layers of a single electrode. For example, the diagnostic module 185 may be configured to determine that the first layer 814*a* of the first electrode 304 is non-reactive (e.g., because there is not a complementary electrode to the left of the first electrode 304 sufficient to generate a current). Similarly, the diagnostic module 185 may be configured to determine that the potential at the second layer 814*b* of the first electrode 304 may be given by the potential at the positive node 216 vs. the potential measured by the first reference electrode 800. Further, the diagnostic module 185 may be configured to determine that the potential of the third layer 816*a* of the second electrode 308 may be given by the potential at the negative node 220 vs. the potential measured by the first reference electrode 800. The diagnostic module 185 may also be configured to determine that the potential of the fourth layer 816*b* of the second electrode 308 may be given by the potential at the negative node 220 vs. the potential measured by the third reference electrode 802.

Continuing, in some examples, the diagnostic module 185 may be configured to determine that the potential of the first layer 818*a* of the first electrode 332 of the supercapacitor 208 may be given by the potential at the positive node 216 vs. the potential measured by the third reference electrode 802. In addition, the diagnostic module 185 may be configured to determine that the potential of the second layer 818*b* of the first electrode 332 may be given by the potential at the positive node 216 vs. the potential measured by the second reference electrode 804. Furthermore, the diagnostic module 185 may be configured to determine that the potential of the third layer 820*a* of the second electrode 336 of the supercapacitor 208 may be given by the potential at the negative node 220 vs. the potential measured by the second reference electrode 804. Finally, the diagnostic module 185 may be configured to determine that the fourth layer 820*b* of the second electrode 336 is non-reactive (e.g., because there is not a complementary electrode to the right of the second electrode 336 sufficient to generate a current).

As stated above, while the example of a single layer LIB and a single layer supercapacitor is discussed above, the LIB may include multiple layers and/or the supercapacitor may include multiple layers. Layers of a multilayer LIB are connected in parallel. Layers of a multilayer supercapacitor are connected in parallel, and the supercapacitor electrodes may be connected to the positive node 216 (e.g., via a first switch) and/or the negative node 220 (e.g., via a second switch).

Figure 9:
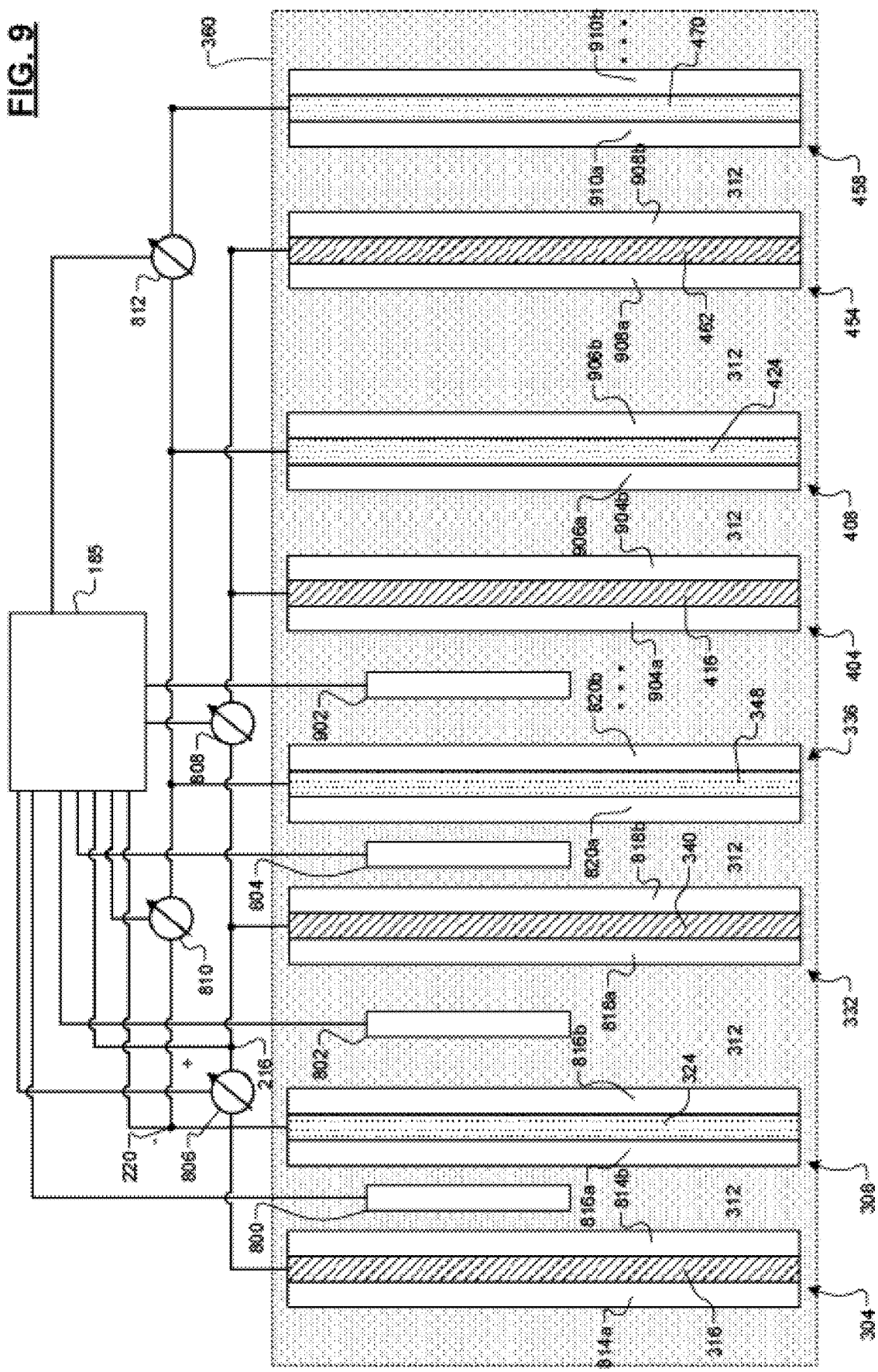
FIG. 9 includes an example diagram including a multilayer LIB, a multilayer supercapacitor, and a plurality of reference electrodes.

FIG. 9 illustrates an example implementation of a battery and supercapacitor system similar to those illustrated in FIGS. 7-8. FIG. 9 is similar to FIG. 7 in that the electrodes of the LIB 204 (i.e., the electrodes 304, 306, 404, 408) are intermixed with the electrodes of the supercapacitor (i.e., the electrodes 332, 336, 454, 458). FIG. 9 is similar to FIG. 8 in that a plurality of reference electrodes (i.e., the reference electrodes 800, 802, 804, 902) are disposed between various electrodes of the LIB 204 and the supercapacitor 208. In addition, FIG. 9 is similar to FIG. 8 in that the current sensors 806, 808, 810, and 812 are connected to the current conductors 316, 324, 340, 348, 416, 424, 462, 470. In addition, the diagnostic module 185 is connected to the positive node 216, the negative node 220, the reference electrodes 800, 802, 804, 902 and the current sensors 806, 808, 810, and 812.

Notably, FIG. 9 illustrates a fourth reference electrode 902 disposed between the second electrode 336 of the first pair of electrodes 332, 336 of the supercapacitor 208 and the first electrode 404 of the second pair of electrodes 404, 408 of the LIB 204. Accordingly, the fourth reference electrode 902 is configured to measure a potential at a location between the second electrode 336 and the first electrode 404. Moreover, the fourth reference electrode is not connected to any of the electrodes 304, 308, 332, 336, 404, 408, 454, 458 within the housing 320.

According to some examples, additional reference electrodes (connected to the diagnostic module 185) may be included between the electrode 404 and the electrode 408, between the electrode 408 and the electrode 454, between the electrode 454 and the electrode 458, etc., without deviating from the teachings herein. The reference electrodes 800, 802, 804, 902 may functional substantially similar to the reference electrodes described in the context of FIG. 8. Similarly, the current sensors 806, 808, 810, 812 may function substantially similar to the current sensors described in the context of FIG. 8.

According to some examples, the diagnostic module 185 may be configured to make use of the potential measurement obtained via the fourth reference electrode 902 to diagnose a fault in the LIB 204 and/or the supercapacitor 208.

For example, the diagnostic module 185 may be configured to diagnose a fault in the LIB 204 and/or the supercapacitor 208 based on at least two of: the potential measured by the first reference electrode 800, the potential measured by the second reference electrode 804, the potential measured by the third reference electrode 802, the potential measure by the fourth reference electrode 902, the potential at the positive node 216, and the potential at the negative node 220.

According to another example, the diagnostic module 185 is configured to diagnose a fault in the LIB 204 and/or the supercapacitor 208 based on a comparison of: (i) the potential measured by the first reference electrode 800, the potential measured by the second reference electrode 804, the potential measured by the third reference electrode 802, the potential measured by the fourth reference electrode 902, the potential at the positive node 216, and/or the potential at the negative node 220 with (ii;) the potential measured by the first reference electrode 800, the potential measured by the second reference electrode 804, the potential measured by the third reference electrode 802, the potential measured by the fourth reference electrode 902, the potential at the positive node 216, and/or the potential at the negative node 220.

According to yet another example, the diagnostic module 185 is configured to diagnose a fault in the LIB 204 and/or the supercapacitor 208 based on a comparison of: (i) the potential at the positive node 216 and/or the potential at the negative node 220; with (ii) the potential measured by the first reference electrode 800, the potential measured by the second reference electrode 804, the potential measured by the third reference electrode 802, and/or the potential measured by the fourth reference electrode 902.

According to still another example, the diagnostic module 185 is configured to diagnose a fault in the LIB 204 and/or the supercapacitor 208 based on the current measured by the first current sensor 806, the current measured by the second current sensor 808, the current measured by the third current sensor 810, and/or the current measured by the fourth current sensor 812.

Furthermore, and although not shown, according to some implementations, one or more of the current conductors 316, 324, 340, 348, 416, 424, 462, 470 may be connected to one or more switches, similar to the implementation illustrated in FIG. 7.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A battery and supercapacitor system of a vehicle, comprising:
   a lithium ion battery (LIB) comprising first and second electrodes;
   a supercapacitor comprising third and fourth electrodes;
   a first reference electrode disposed between the first and second electrodes and configured to measure a first potential at a first location between the first and second electrodes;
   a second reference electrode disposed between the third and fourth electrodes and configured to measure a second potential at a second location between the third and fourth electrodes,
   wherein:
      the first electrode is connected to the third electrode;
      the second electrode is connected to the fourth electrode;
      the first reference electrode is not connected to any of the first, second, third, and fourth electrodes; and
      the second reference electrode is not connected to any of the first, second, third, and fourth electrode; and
   a diagnostic module that is:
      connected to the first reference electrode, a first node connected between the first and third electrodes, a second node connected between the second and fourth electrodes, and the second reference electrode; and
      configured to diagnose a fault in at least one of the LIB and the supercapacitor based on at least two of: the first potential, the second potential, a third potential at the first node, and a fourth potential at the second node.

2. The battery and supercapacitor system of claim 1, wherein the diagnostic module is configured to diagnose the fault in the at least one of the LIB and the supercapacitor based on a comparison of:
   (i) one of the first potential, the second potential, the third potential, and the fourth potential; with
   (ii) another one of the first potential, the second potential, the third potential, and the fourth potential.

3. The battery and supercapacitor system of claim 1, wherein the diagnostic module is configured to diagnose the fault in the at least one of the LIB and the supercapacitor based on a comparison of:
   (i) one of the third potential and the fourth potential; with
   (ii) one of the first potential and the second potential.

4. The battery and supercapacitor system of claim 1 further comprising:
   a first current sensor between the first electrode and the first node, the first current sensor configured to measure a first current through the first electrode;
   a second current sensor between the first node and the third electrode, the second current sensor configured to measure a second current through the third electrode;
   a third current sensor between the second electrode and the second node, the third current sensor configured to measure a third current through the second electrode; and
   a fourth current sensor between the second node and the fourth electrode, the fourth current sensor configured to measure a fourth current through the fourth electrode,
   wherein the diagnostic module is connected to the first, second, third, and fourth current sensors, and
   wherein the diagnostic module is further configured to diagnose a fault in at least one of the LIB and the supercapacitor based on at least one of the first, second, third, and fourth currents.

5. The battery and supercapacitor system of claim 1, further comprising:
   a third reference electrode disposed between the second and third electrodes and configured to measure a fifth potential at a third location between the second and third electrodes,
   wherein the third reference electrode is not connected to any of the first, second, third, and fourth electrodes.

6. A system comprising:
   the battery and supercapacitor system of claim 5,
   wherein the diagnostic module is:
      further the third reference electrode; and
      configured to diagnose a fault in at least one of the LIB and the supercapacitor based on at least two of: the first potential, the second potential, the third potential at the first node, the fourth potential at the second node, and the fifth potential.

7. The system of claim 6, wherein the diagnostic module is configured to diagnose the fault in the at least one of the LIB and the supercapacitor based on a comparison of:
   (i) one of the first potential, the second potential, the third potential, the fourth potential, and the fifth potential; with
   (ii) another one of the first potential, the second potential, the third potential, the fourth potential, and the fifth potential.

8. The system of claim 6, wherein the diagnostic module is configured to diagnose the fault in the at least one of the LIB and the supercapacitor based on a comparison of:
   (i) one of the third potential and the fourth potential; with
   (ii) one of the first potential, the second potential, and the fifth potential.

9. The system of claim 6, wherein the battery and supercapacitor system further comprises:
   a first current sensor between the first electrode and the first node, the first current sensor configured to measure a first current through the first electrode;
   a second current sensor between the first node and the third electrode, the second current sensor configured to measure a second current through the third electrode;

a third current sensor between the second electrode and the second node, the third current sensor configured to measure a third current through the second electrode; and a fourth current sensor between the second node and the fourth electrode, the fourth current sensor configured to measure a fourth current through the fourth electrode, wherein the diagnostic module is connected to the first, second, third, and fourth current sensors, and wherein the diagnostic module is further configured to diagnose a fault in at least one of the LIB and the supercapacitor based on at least one of the first, second, third, and fourth currents.

10. The battery and supercapacitor system of claim 1, wherein:

the LIB further comprises fifth and sixth electrodes; and the supercapacitor further comprises seventh and eighth electrodes, wherein the third and fourth electrodes of the supercapacitor are disposed between: (i) the first and second electrodes of the LIB; and (ii) the fifth and sixth electrodes of the LIB, and wherein the fifth and sixth electrodes of the LIB are disposed between: (i) the third and fourth electrodes of the supercapacitor; and (ii) the seventh and eighth electrodes of the supercapacitor.

11. The battery and supercapacitor system of claim 10, further comprising:

a third reference electrode disposed between the second and third electrodes and configured to measure a fifth potential at a third location between the second and third electrodes, wherein the third reference electrode is not connected to any of the first, second, third, and fourth electrodes, a fourth reference electrode disposed between the fourth and fifth electrodes and configured to measure a sixth potential at a fourth location between the fourth and fifth electrodes, wherein the fourth reference electrode is not connected to any of the first, second, third, fourth, fifth, sixth, seventh, and eighth electrodes.

12. A system comprising:

the battery and supercapacitor system of claim 11; and a diagnostic module that is:

connected to the first reference electrode, a first node connected between the first and third electrodes, the third reference electrode, a second node connected between the second and fourth electrodes, the second reference electrode, and the fourth reference electrode; and configured to diagnose a fault in at least one of the LIB and the supercapacitor based on at least two of: the first potential, the second potential, a third potential at the first node, a fourth potential at the second node, the fifth potential, and the sixth potential.

13. The system of claim 12, wherein the diagnostic module is further configured to diagnose the fault in the at least one of the LIB and the supercapacitor based on a comparison of:

(i) one of the first potential, the second potential, the third potential, the fourth potential, the fifth potential, and the sixth potential; with (ii) another one of the first potential, the second potential, the third potential, the fourth potential, the fifth potential, and the sixth potential.

14. The system of claim 12, wherein the diagnostic module is further configured to diagnose the fault in the at least one of the LIB and the supercapacitor based on a comparison of:

(i) one of the third potential and the fourth potential; with (ii) one of the first potential, the second potential, the fifth potential, and the sixth potential.

15. The battery and supercapacitor system of claim 1, wherein:

the first electrode includes lithium manganese oxide (LMO); and the second electrode includes lithium titanium oxide (LTO).

16. The battery and supercapacitor system of claim 1, wherein the third and fourth electrodes include at least one of activated carbon, conductive polymer, and metal oxide.

17. The battery and supercapacitor system of claim 1, wherein at least one of the first and second reference electrodes includes at least one of Li metal, Li plated metal wires, Li based alloy, lithium iron phosphate (LFP) and lithium titanium oxide.

18. The battery and supercapacitor system of claim 1, wherein at least one of the first and second electrodes includes at least one of lithium nickel manganese cobalt oxide (NMC), lithium manganese oxide (LMO), lithium iron phosphate (LFP), graphite, and lithium titanium oxide (LTO).

19. The battery and supercapacitor system of claim 4, wherein at least one of the first, second, third, and fourth current sensors has an accuracy in at least one of the following ranges: (i) 1 micro amp-1 amp; and (ii) 1 milli-amp-100 amps.

20. A battery and supercapacitor system of a vehicle, comprising:

a lithium ion battery (LIB) comprising first and second electrodes;

a supercapacitor comprising third and fourth electrodes;

a first reference electrode disposed between the first and second electrodes and configured to measure a first potential at a first location between the first and second electrodes;

a second reference electrode disposed between the third and fourth electrodes and configured to measure a second potential at a second location between the third and fourth electrodes, wherein:

the first electrode is connected to the third electrode;

the second electrode is connected to the fourth electrode;

the first reference electrode is not connected to any of the first, second, third, and fourth electrodes; and the second reference electrode is not connected to any of the first, second, third, and fourth electrodes; and a third reference electrode disposed between the second and third electrodes and configured to measure a fifth potential at a third location between the second and third electrodes, wherein the third reference electrode is not connected to any of the first, second, third, and fourth electrodes.

21. A battery and supercapacitor system of a vehicle, comprising:

a lithium ion battery (LIB) comprising first and second electrodes;

a supercapacitor comprising third and fourth electrodes;

a first reference electrode disposed between the first and second electrodes and configured to measure a first potential at a first location between the first and second electrodes;

a second reference electrode disposed between the third and fourth electrodes and configured to measure a second potential at a second location between the third and fourth electrodes, wherein:
  the first electrode is connected to the third electrode;
  the second electrode is connected to the fourth electrode;
  the first reference electrode is not connected to any of the first, second, third, and fourth electrodes; and
  the second reference electrode is not connected to any of the first, second, third, and fourth electrodes; and
the LIB further comprises fifth and sixth electrodes; and
the supercapacitor further comprises seventh and eighth electrodes,
wherein the third and fourth electrodes of the supercapacitor are disposed between: (i) the first and second electrodes of the LIB; and (ii) the fifth and sixth electrodes of the LIB, and wherein the fifth and sixth electrodes of the LIB are disposed between: (i) the third and fourth electrodes of the supercapacitor; and (ii) the seventh and eighth electrodes of the supercapacitor.

* * * * *